(12) United States Patent
Chen et al.

(10) Patent No.: US 10,965,851 B2
(45) Date of Patent: Mar. 30, 2021

(54) CAMERA DEVICE AND MOBILE TERMINAL HAVING SAME

(71) Applicant: TRIPLE WIN TECHNOLOGY(SHENZHEN) CO.LTD., Shenzhen (CN)

(72) Inventors: Shin-Wen Chen, New Taipei (TW); Long-Fei Zhang, Guangdong (CN); Kun Li, Guangdong (CN); Xiao-Mei Ma, Guangdong (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/558,596

(22) Filed: Sep. 3, 2019

(65) Prior Publication Data
US 2021/0051251 A1    Feb. 18, 2021

(30) Foreign Application Priority Data
Aug. 12, 2019 (CN) .......................... 201910741034.9

(51) Int. Cl.
| | | |
|---|---|---|
| H04N 5/225 | (2006.01) | |
| H05K 1/18 | (2006.01) | |
| H05K 1/14 | (2006.01) | |
| H01L 23/00 | (2006.01) | |
| H01L 27/146 | (2006.01) | |

(52) U.S. Cl.
CPC ........... *H04N 5/2254* (2013.01); *H01L 24/48* (2013.01); *H01L 27/14618* (2013.01); *H04N 5/2253* (2013.01); *H05K 1/147* (2013.01); *H05K 1/182* (2013.01); *H05K 1/189* (2013.01); *H01L 2224/48155* (2013.01); *H05K 2201/09072* (2013.01); *H05K 2201/10121* (2013.01)

(58) Field of Classification Search
CPC .................................................. H04N 5/2253
USPC ........................................................ 348/374
See application file for complete search history.

(56) References Cited

U.S. PATENT DOCUMENTS

| | | | |
|---|---|---|---|
| 2016/0241787 A1* | 8/2016 | Sekimoto | H04N 5/2254 |
| 2017/0142303 A1* | 5/2017 | Wang | H04N 5/2253 |
| 2018/0113378 A1* | 4/2018 | Wang | H04N 5/2258 |
| 2019/0137728 A1* | 5/2019 | Wan | H04N 5/2257 |
| 2019/0141224 A1* | 5/2019 | Park | H01L 27/14625 |
| 2020/0007726 A1* | 1/2020 | Wang | G03B 17/02 |
| 2020/0036897 A1* | 1/2020 | Kuo | H04N 5/2253 |

FOREIGN PATENT DOCUMENTS

| | | |
|---|---|---|
| CN | 108055444 A | 5/2018 |
| CN | 108363159 A | 8/2018 |

* cited by examiner

*Primary Examiner* — Anthony J Daniels
(74) *Attorney, Agent, or Firm* — ScienBiziP, P.C.

(57) ABSTRACT

A camera device includes a lens assembly, a driver, and a photosensitive assembly. The driver drives the lens assembly. The photosensitive assembly is mounted to the lens assembly. The photosensitive assembly includes a filter, a photosensitive chip, a first circuit board, and a second circuit board. The first circuit board defines a first through hole. The photosensitive chip is received in the first through hole. The filter is fixed to a side of the first circuit board and covers the first through hole. The second circuit board is fixed to a side of the first circuit board facing away from the filter and is electrically coupled to the first circuit board. The photosensitive chip is electrically coupled to the second circuit board.

16 Claims, 7 Drawing Sheets

CAMERA DEVICE AND MOBILE TERMINAL HAVING SAME

FIELD

The subject matter herein generally relates to camera devices, and more particularly to a camera device having a reduced thickness.

BACKGROUND

With the continuous development of intelligent electronic devices, requirements for camera devices are becoming higher. Camera devices of the intelligent electronic devices are also required to become smaller. How to further reduce the thickness of the camera device has become an urgent problem to be solved.

BRIEF DESCRIPTION OF THE DRAWINGS

Implementations of the present disclosure will now be described, by way of embodiments, with reference to the attached figures.

DETAILED DESCRIPTION

Figure 1:
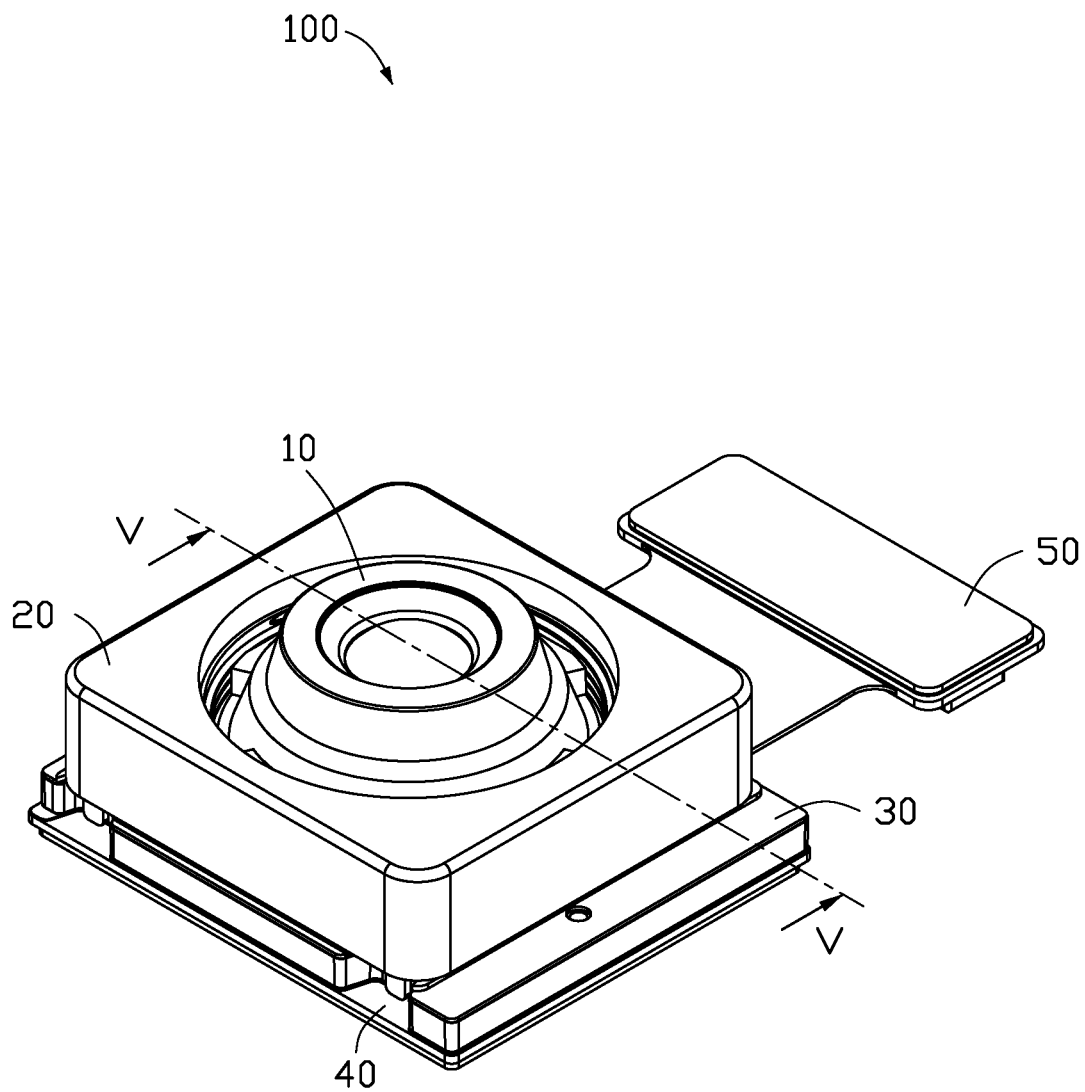
FIG. 1 is an assembled, isometric view of an embodiment of a camera device.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 2:
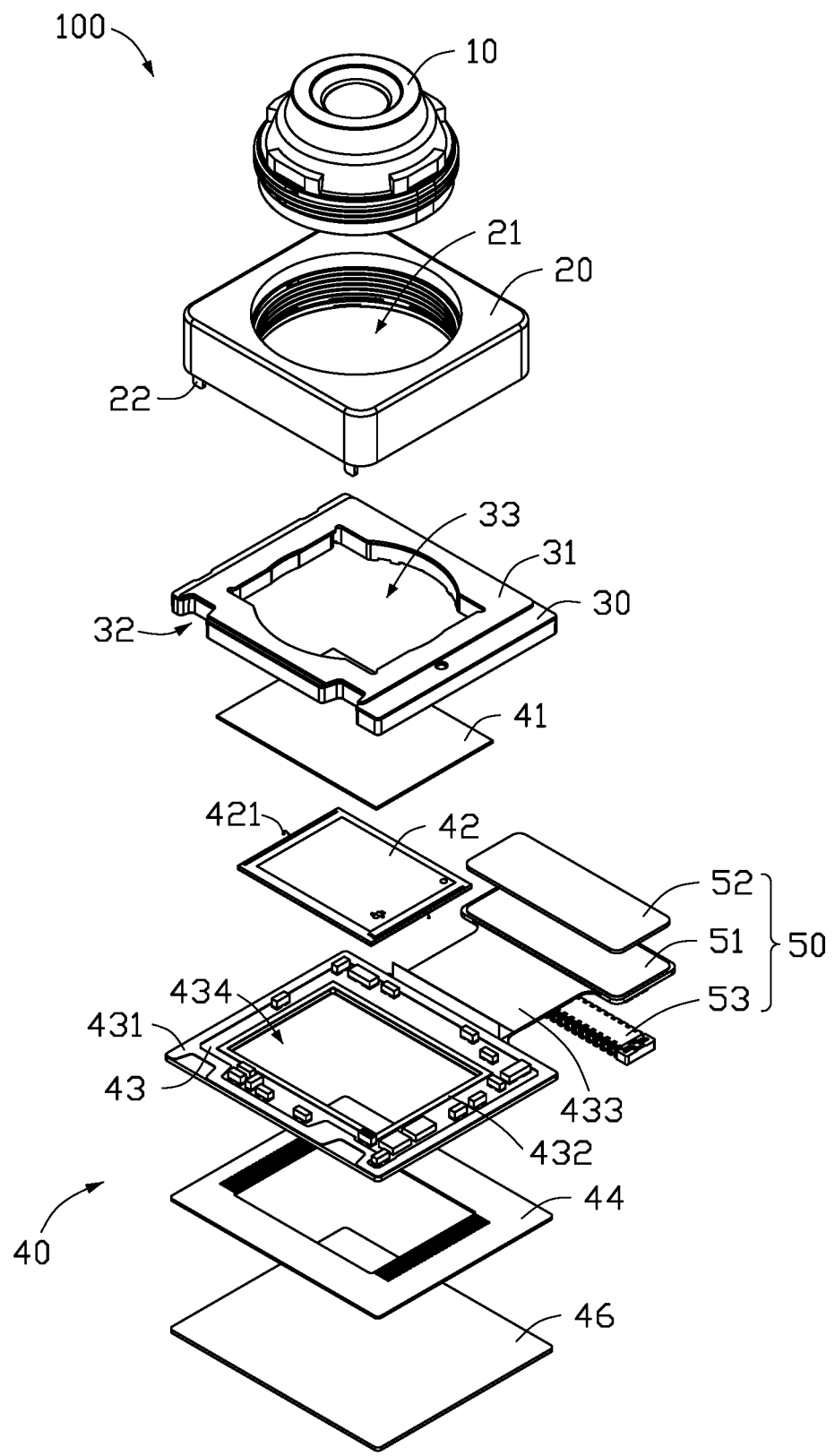
FIG. 2 is an exploded, isometric view of the camera device in FIG. 1.

FIGS. 1 and 2 show an embodiment of a camera device 100. The camera device 100 includes a lens assembly 10, a driver 20, and a photosensitive assembly 40. The driver 20 is configured to drive the lens assembly 10 to adjust a focal length of the lens assembly 10. The photosensitive assembly 40 is located on a bottom of the lens assembly 10. The photosensitive member 40 includes a filter 41, a photosensitive chip 42, a first circuit board 43, and a second circuit board 44. A first through hole 434 is defined in the first circuit board 43, and the photosensitive chip 42 is configured to be received in the first through hole 434. The filter 41 is fixed on a side of the first circuit board 43 and covers the first through hole 434. The second circuit board 44 is fixed on a side of the first circuit board 43 facing away from the filter 41 and electrically couples to the first circuit board 43. The photosensitive chip 42 and the second circuit board 44 are electrically coupled together.

The camera device 100 includes a mounting base 30 configured to be fixed over the filter 41 on the first circuit board 43. The lens assembly 10 and the driver 20 are mounted on the mounting base 30, and the driver 20 is electrically coupled to the first circuit board 43. The driver 20 is fixed to a side of the mounting base 30 by a first fixing member 31. The mounting base 30 is fixed to the first circuit board 43 by a second fixing member 431. In one embodiment, the first fixing member 31 and the second fixing member 431 may be an adhesive glue, a hot melt adhesive, or the like, such that the first circuit board 43, the driver 20, and the mounting base 30 are fixed together.

A second through hole 33 is defined in the mounting base 30. The driver 20 defines an inner cavity 21 configured to communicate with the second through hole 33, and the lens assembly 10 is coupled to the driver 20 and mounted in the inner cavity 21. The driver 20 is configured to drive the lens assembly 10 to move along an axis of the inner cavity 21 and the second through hole 33. A peripheral side of the mounting base 30 defines at least one notch 32 through which the first circuit board 43 is exposed. At least one support leg 22 extends from a side of the driver 20 corresponding to the at least one notch 32. When the driver 20 is fixed on the mounting base 30, the support leg 22 passes through the notch 32 and contacts the first circuit board 43. The driver 20 is electrically coupled to the first circuit board 43 through the support leg 22.

Figure 3:
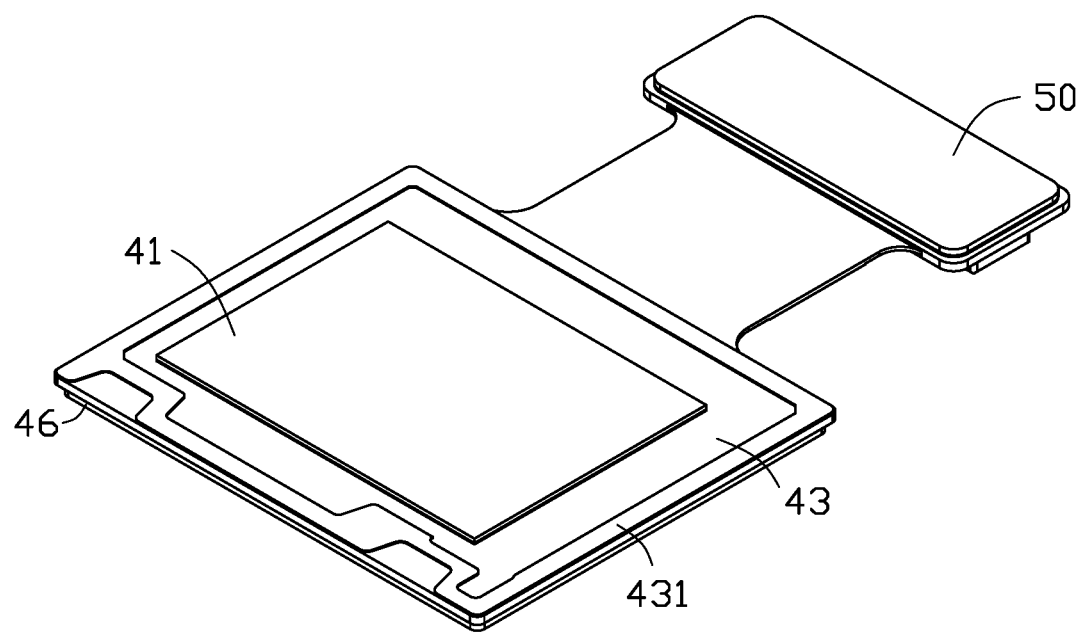
FIG. 3 is an isometric view of a photosensitive assembly and an electrical connection assembly of the camera device.
Figure 4:
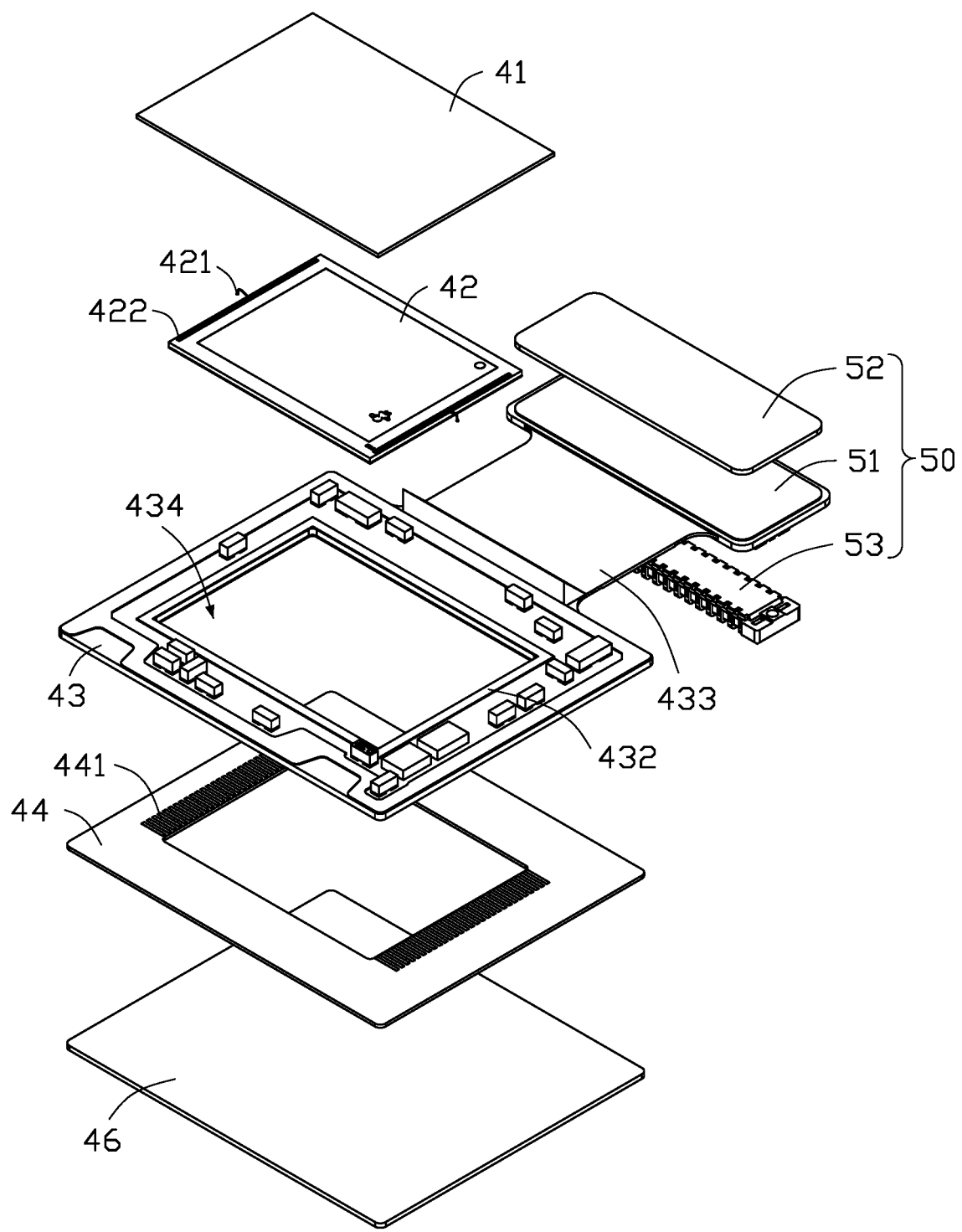
FIG. 4 is an exploded, isometric view of the FIG. 3.

Referring to FIG. 3 and FIG. 4, a third fixing member 432 is located around an edge of the first through hole 434. The filter 41 is fixed to the first circuit board 43 by the third fixing member 432 and covers the first through hole 434. In one embodiment, the third fixing member 432 may be an adhesive, a hot melt adhesive, or the like, for fixing the first circuit board 43 to the filter 41. The second circuit board 44 is coupled to the first circuit board 43 through a connector 45 (shown in FIG. 6). In one embodiment, the second circuit board 44 is a flexible circuit board, and the connector 45 is a conductive adhesive, such as an anisotropic conductive film (ACF). The ACF glue is only conductive in a Z direction (vertical direction in FIG. 6), and is non-conductive in X and Y directions (horizontal directions in FIG. 6), thereby preventing a short circuit by the first circuit board 43 coming in contact with an edge of the second circuit board 44. In other embodiments, the first circuit board 43 and the second circuit board 44 may be electrically coupled by copper plating, and the connector 45 is an electrical connector that can be copper plated or soldered.

A first electrical connection portion 422 is located on an edge of the photosensitive chip 42, and a second electrical connection portion 441 corresponding to the first electrical connection portion 422 is located on the second circuit board 44. The photosensitive chip 42 is electrically coupled to the second circuit board 44 by at least one wire 421. The first electrical connection portion 422 and the second electrical connection portion 441 each include a plurality of circuit interfaces, and two ends of the wire 421 are respectively soldered to circuit interfaces of the first electrical connection portion 422 and the second electrical connection portion 441.

Figure 5:
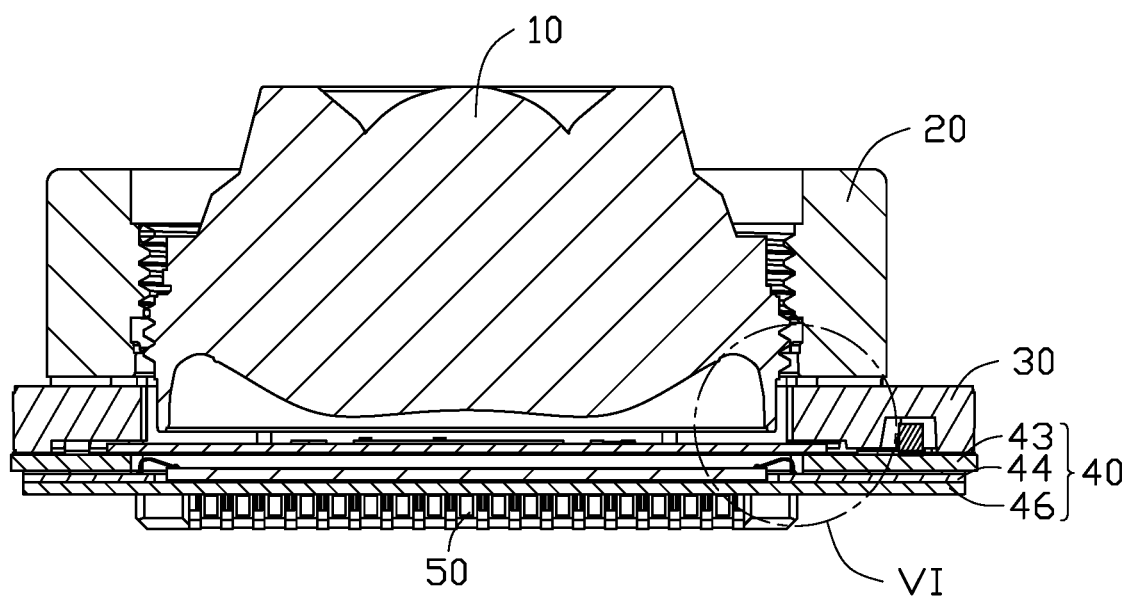
FIG. 5 is a cross-sectional view taken along line V-V in FIG. 1.
Figure 6:
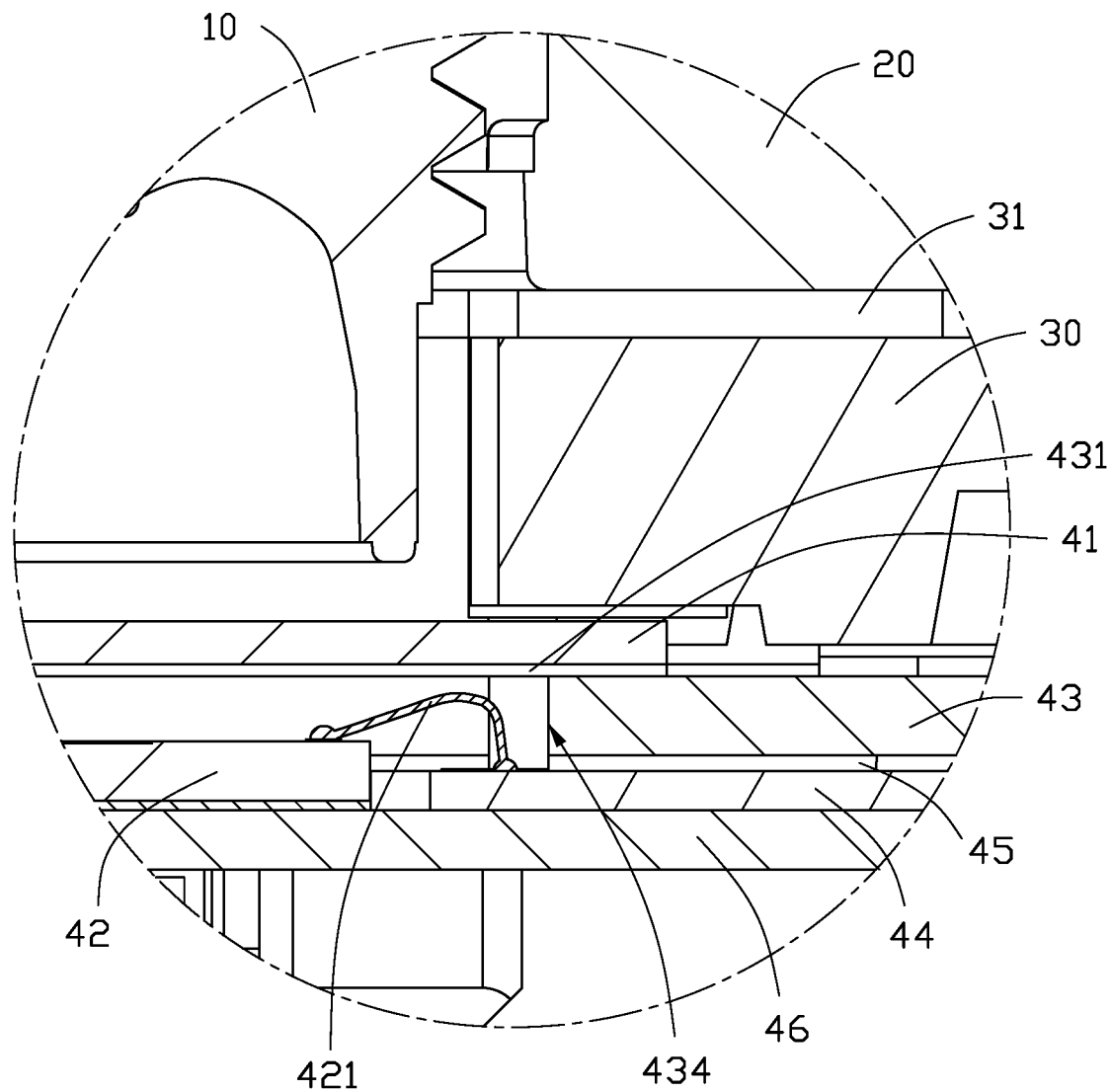
FIG. 6 is a close-up view of circled portion VI in FIG. 5.

Referring to FIG. 5 and FIG. 6, the camera device 100 further includes a first cover 46 fixed on a side of the second circuit board 44 facing away from the first circuit board 43. The photosensitive chip 42 received in the first through hole 434 is fixed on the first cover 46 and aligned with the first through hole 434. In one embodiment, the first cover 46 may be a steel plate or other metal plate covering the bottom of the camera device 100 to protect an internal structure of the camera device 100 and dissipate heat generated by the photosensitive chip 42. In other embodiments, the first cover 46 can be made of other high-strength materials. The photosensitive chip 42 may be attached to the surface of the first cover 46 by hot melt adhesive or adhesive glue. In other embodiments, the photosensitive chip 42 may also be fixed to the first cover 46 by soldering or surface mount technology.

The photosensitive chip 42 attached to the first cover 46 is received in a space formed by the first through hole 434 and a central through hole of the second circuit board 44, and the wire 421 is accommodated in the first through hole 434. Thus, a height of the photosensitive chip 42 is lower than a height of the first circuit board 43, and a highest point of the wire 421 is lower than the height of the first circuit board 43. In the related art, the photosensitive chip 42 and the wire 421 are directly located on the surface of the first circuit board 43, and the filter 41 has to be spaced apart from the first circuit board 43. In contrast, in the present disclosure, the photosensitive chip 42 and the wire 421 are located within the first through hole 434 and the through hole of the second circuit board 44, so that the filter 41 can be directly mounted on the first circuit board 43 to eliminate a distance between the filter 41 and the first circuit board 43. Thus, a holder for the filter 41 is not required, and a thickness of the camera device 100 is reduced by at least 0.36 mm.

Referring again to FIGS. 1 and 2, the camera device 100 further includes an electrical connection assembly 50 for connecting to an external power source or electrical device. The electrical connection assembly 50 includes a third circuit board 51, a second cover 52, and an electrical connector 53. The third circuit board 51 is electrically coupled to the first circuit board 43 through a connecting plate 433. The second cover 52 is attached to one side of the third circuit board 51 for protecting the third circuit board 51. The electrical connector 53 is attached to a side of the third circuit board 51 facing away from the second cover 52. The electrical connection assembly 50 is connected to an external power source or an electrical device through the electrical connector 53.

Figure 7:
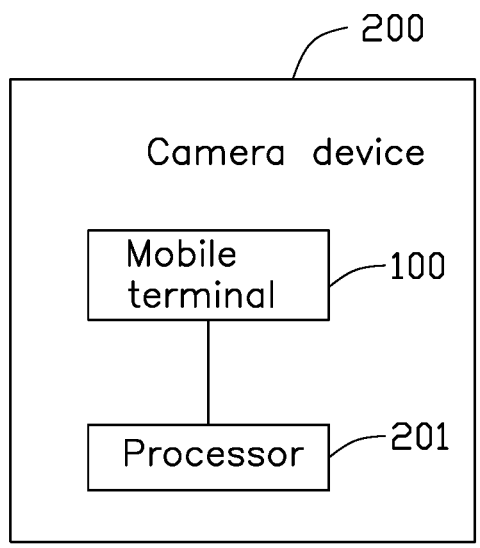
FIG. 7 is a block diagram of an embodiment of a mobile terminal having the camera device in FIG. 1.

FIG. 7 shows a block diagram of a mobile terminal 200 including a processor 201 and the above-described camera device 100. The processor 201 is electrically coupled to the electrical connection assembly 50 of the camera device 100 to control the camera device 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A camera device comprising:
   a lens assembly;
   a driver configured to drive the lens assembly;
   a photosensitive assembly mounted to the lens assembly; and
   a mounting base; wherein:
   the photosensitive assembly comprises a filter, a photosensitive chip, a first circuit board, and a second circuit board;
   the first circuit board defines a first through hole, the photosensitive chip being received in the first through hole;
   the filter is fixed to a side of the first circuit board and covers the first through hole;
   a peripheral side of the mounting base defines at least one notch through which the first circuit board is exposed, the driver is provided with at least one support leg corresponding to the at least one notch, the mounting base is fixed to the first circuit board over the filter, and the at least one support leg passes through the at least one notch to connect the first circuit board;
   the second circuit board is fixed to a side of the first circuit board facing away from the filter and is electrically coupled to the first circuit board; and
   the photosensitive chip is electrically coupled to the second circuit board.

2. The camera device of claim 1, wherein:
   the photosensitive chip is electrically coupled to the second circuit board by at least one wire; and
   the at least one wire is received in the first through hole.

3. The camera device of claim 2, wherein:
   a first electrical connection portion is located on an edge of the photosensitive chip;
   a second electrical connection portion corresponding to the first electrical connection portion is located on the second circuit board; and
   two ends of the wire are respectively soldered to the first electrical connection portion and the second electrical connection portion.

4. The camera device of claim 1, wherein:
   the first circuit board is fixed to and electrically coupled to the second circuit board by a connector.

5. The camera device of claim 4, wherein:
   the connector is a conductive adhesive.

6. The camera device of claim 1, wherein:
   the lens assembly is mounted to the mounting base; and
   the driver is electrically coupled to the first circuit board.

7. The camera device of claim 6, wherein:
   the mounting base defines a second through hole;
   the driver defines an inner cavity communicating with the second through hole;
   the lens assembly is mounted in the inner cavity and is movable within a space formed by the second through hole and the inner cavity.

8. The camera device of claim 1, further comprising an electrical connection assembly electrically coupled to the first circuit board, wherein:
   the electrical connection assembly is configured to electrically couple to an external power source or electrical device.

9. A mobile terminal comprising a camera device and a processor, the camera device comprising:
   a lens assembly;
   a driver configured to drive the lens assembly;
   a photosensitive assembly mounted to the lens assembly; and a mounting base; wherein:

the photosensitive assembly comprises a filter, a photosensitive chip, a first circuit board, and a second circuit board; the first circuit board defines a first through hole, the photosensitive chip being received in the first through hole; the filter is fixed to a side of the first circuit board and covers the first through hole;

a peripheral side of the mounting base defines at least one notch through which the first circuit board is exposed, the driver is provided with at least one support leg corresponding to the at least one notch, the mounting base is fixed to the first circuit board over the filter, and the at least one support leg passes through the at least one notch to connect the first circuit board;

the second circuit board is fixed to a side of the first circuit board facing away from the filter and is electrically coupled to the first circuit board; and the photosensitive chip is electrically coupled to the second circuit board.

10. The mobile terminal of claim 9, wherein:

the photosensitive chip is electrically coupled to the second circuit board by at least one wire; and the at least one wire is received in the first through hole.

11. The mobile terminal of claim 10, wherein:

a first electrical connection portion is located on an edge of the photosensitive chip;

a second electrical connection portion corresponding to the first electrical connection portion is located on the second circuit board; and two ends of the wire are respectively soldered to the first electrical connection portion and the second electrical connection portion.

12. The mobile terminal of claim 9, wherein:

the first circuit board is fixed to and electrically coupled to the second circuit board by a connector.

13. The mobile terminal of claim 12, wherein:

the connector is a conductive adhesive.

14. The mobile terminal of claim 9, wherein:

the lens assembly is mounted to the mounting base; and the driver is electrically coupled to the first circuit board.

15. The mobile terminal of claim 14, wherein:

the mounting base defines a second through hole;

the driver defines an inner cavity communicating with the second through hole;

the lens assembly is mounted in the inner cavity and is movable within a space formed by the second through hole and the inner cavity.

16. The mobile terminal of claim 9, wherein:

the camera device further comprises an electrical connection assembly electrically coupled to the first circuit board; and the electrical connection assembly is electrically coupled to the processor.

\* \* \* \* \*